United States Patent [19]
Gutowski et al.

[11] Patent Number: 6,133,577
[45] Date of Patent: Oct. 17, 2000

[54] METHOD AND APPARATUS FOR PRODUCING EXTREME ULTRA-VIOLET LIGHT FOR USE IN PHOTOLITHOGRAPHY

[75] Inventors: Robert M. Gutowski, Glen Oaks; Vincent Calia, Greenlawn, both of N.Y.; Alan M. Todd, Princeton, N.J.

[73] Assignee: Advanced Energy Systems, Inc., Bethpage, N.Y.

[21] Appl. No.: 08/794,802

[22] Filed: Feb. 4, 1997

[51] Int. Cl.[7] .................................................. G21G 4/00
[52] U.S. Cl. ................................. 250/493.1; 250/492.1
[58] Field of Search ........................... 250/493.1, 492.1, 250/504 R

[56] References Cited

U.S. PATENT DOCUMENTS

| | | | |
|---|---|---|---|
| 3,156,950 | 11/1964 | Walton, Jr. ........................... | 18/8 |
| 3,686,528 | 8/1972 | Sheets ................................... | 315/111 |
| 3,709,434 | 1/1973 | Gebbardt et al. .................... | 239/8 |
| 3,876,591 | 4/1975 | Futerko ................................ | 239/398 |
| 3,972,474 | 8/1976 | Keur ..................................... | 239/102 |
| 4,161,280 | 7/1979 | Kasinskas ............................ | 239/1 |
| 4,178,078 | 12/1979 | Hausmann ............................ | 350/319 |
| 4,408,338 | 10/1983 | Grobman .............................. | 378/34 |
| 4,455,470 | 6/1984 | Klein et al. .......................... | 219/121 |
| 4,549,082 | 10/1985 | McMillan ............................. | 250/423 |
| 4,560,880 | 12/1985 | Perrie et al. ......................... | 250/441.1 |
| 4,577,122 | 3/1986 | Kung .................................... | 307/425 |
| 4,584,479 | 4/1986 | Lamattina et al. .................. | 250/441.1 |
| 4,607,167 | 8/1986 | Petric ................................... | 250/492.2 |
| 4,692,934 | 9/1987 | Forsyth ................................ | 378/34 |
| 4,730,784 | 3/1988 | Boch et al. .......................... | 239/416.4 |
| 4,820,927 | 4/1989 | Langner et al. ..................... | 250/492.2 |
| 4,830,280 | 5/1989 | Yankoff ................................ | 239/11 |
| 4,954,715 | 9/1990 | Zold ..................................... | 250/461.1 |
| 4,980,563 | 12/1990 | George et al. ....................... | 250/492.2 |
| 4,982,067 | 1/1991 | Marantz et al. ..................... | 219/121.47 |
| 4,990,789 | 2/1991 | Uesaki .................................. | 250/504 |
| 5,012,105 | 4/1991 | Ando et al. .......................... | 250/398 |
| 5,012,853 | 5/1991 | Bihlmaier ............................. | 164/75 |
| 5,103,102 | 4/1992 | Economou et al. ................. | 250/492.2 |
| 5,175,929 | 1/1993 | Anthony et al ..................... | 29/890.142 |
| 5,185,552 | 2/1993 | Suzuki et al. ....................... | 313/231.71 |
| 5,204,506 | 4/1993 | Asmus et al. ....................... | 219/121.37 |
| 5,214,290 | 5/1993 | Sakai .................................... | 250/492.2 |
| 5,298,835 | 3/1994 | Muehlberger et al. ............. | 315/111.21 |
| 5,376,791 | 12/1994 | Swanson et al. .................... | 250/309 |
| 5,499,282 | 3/1996 | Silfvast ................................. | 378/119 |
| 5,577,092 | 11/1996 | Kublak et al. ...................... | 378/119 |
| 5,643,801 | 7/1997 | Ishihara et al. ..................... | 437/7 |
| 5,644,137 | 7/1997 | Waggener et al. .................. | 250/492.2 |

OTHER PUBLICATIONS

Electron–Gun–Driven EUV Lithography System, OSA Proceedings on Extreme Ultraviolet Lithography, vol. 23, Alan M. M. Todd, Ira S. Lehrman, Jayaram Krishnaswamy, Vincent Calia, and Robert Gutowski, 1994, 274–277.

Electron–Gun–Driven EUV Lithography System, OSA Proceedings On Extreme Ultraviolet Lithography, vol. 23, Alan M. Todd, Ira S. Lehrman, Jayaram Krishnaswamy, Vincent Calia, and Robert Gutowski, 1994, 274–277.

Cluster Formation In Expanding Supersonic Jets: Effect of Pressure, Temperature, Nozzle Size, and Test Gas, O.F. Hagena and W. Obert, The Journal of Chemical Physics, vol. 56, No. 5, Mar. 1, 1972, 1793–1802.

Cluster Ion sources (Invited), Otto F. Hagena, Rev. Sci. Instrum., vol. 63, No. 4, Apr. 1992, 2374–2379.

Density Measurements of a Pulsed Supersonic Gas Jet Using Nuclear Scattering, J.G. Pronco, D. Kohler, I.V. Chapman, T.T. Bardin, P.C. Filbert, and J.D. Hawley, Rev.Sci.Instrum., vol. 64, No. 7, Jul. 1993, 1744–1747.

Primary Examiner—Bruce C. Anderson
Attorney, Agent, or Firm—Baker & Botts, L.L.P.

[57] ABSTRACT

A method and apparatus for producing extreme ultra-violet light comprising a nozzle for flowing a gas at a supersonic velocity, a source for directing a radiated energy beam into the flowing gas to stimulate emission of extreme ultra-violet light therefrom, and a diffuser for capturing a substantial portion of the gas so as to mitigate contamination caused thereby. The extreme ultra-violet light so produced is suitable for use in photolithography for integrated circuit fabrication and the like.

45 Claims, 6 Drawing Sheets

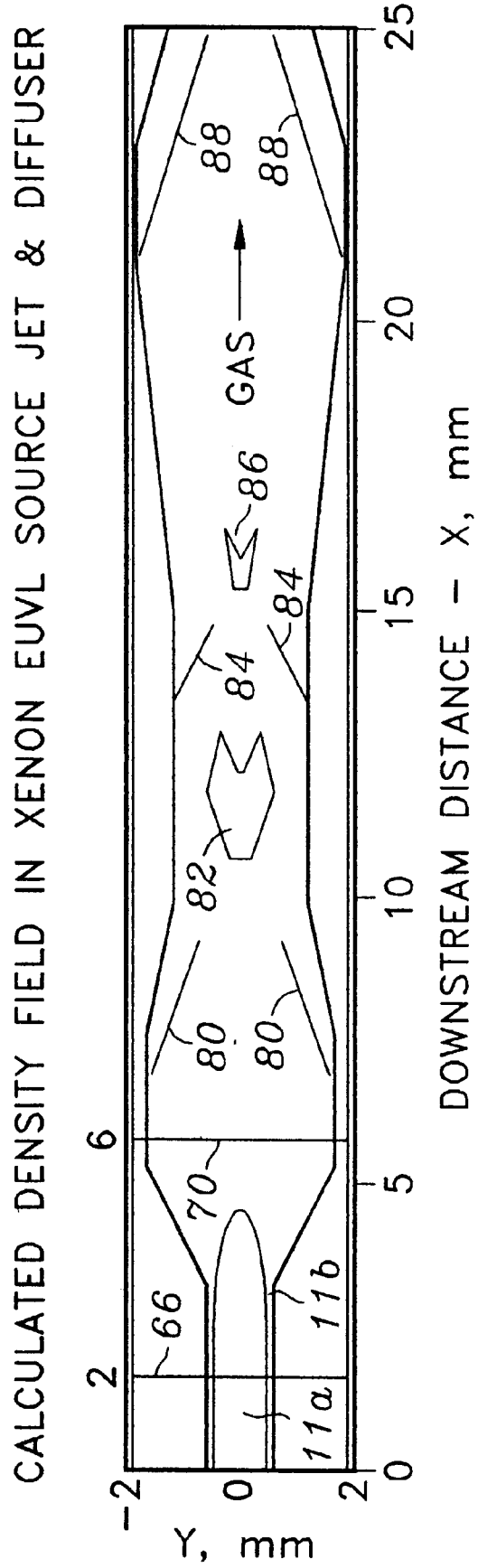

METHOD AND APPARATUS FOR PRODUCING EXTREME ULTRA-VIOLET LIGHT FOR USE IN PHOTOLITHOGRAPHY

FIELD OF THE INVENTION

The present invention relates generally to photolithographic techniques and apparatus for use in the fabrication of semi-conductor components and more particularly to a method for producing extreme ultra-violet light for use in a photolithography system for facilitating the production of semi-conductor components having geometries of 10 nm and smaller.

BACKGROUND OF THE INVENTION

The use of photolithographic techniques in the fabrication of semi-conductor components such as dynamic RAM chips (DRAM), is well known. In the practice of such photolithographic techniques, light is utilized to cure or harden a photomask which prevents the chemical etching of various semi-conductor, conductor, and insulator portions of the device, as desired.

As those skilled in the art will appreciate, the trend is toward semi-conductor components having greater and greater densities. This is particularly true in the area of memory, wherein it is extremely desirable to provide as much memory as possible in a given package.

As those skilled in the art will appreciate, it is necessary to decrease the line size or geometry of the various semi-conductor, conductor, and insulator lines formed upon the component substrate in order to facilitate such increased density. That is, by making the individual devices, i.e., transistors, diodes, etc., formed upon the integrated circuit chip smaller, a larger number of such devices may be formed thereon. This, of course, facilitates fabrication of DRAM chips having greater capacity, for example.

However, when utilizing photolithographic techniques, the lower limit on the line size is defined by the wavelength of the light utilized in the photolithographic process. Thus, extreme ultra-violet light (EUV) is capable of forming smaller line sizes (resulting in greater packaging densities) than is ultra-violet or visible light. Because of this, it is highly desirable to utilize extreme ultra-violet light in the photolithographic processes associated with the fabrication of integrated circuit components.

According to contemporary methodology, two important goals associated with the use of extreme ultra-violet light in such photolithographic processes tend to be mutually exclusive. As those skilled in the art will appreciate, it is desirable to provide an intense source of extreme ultra-violet light and it is also desirable to minimize the generation of debris during the generation of such light.

The curing time is directly proportional to the intensity of the light source. Thus, it is desirable to have an intense light source such that mask curing time may be reduced and the production rate correspondingly increased.

It is desirable to minimize the generation of debris since such debris undesirably absorbs the extreme ultra-violet radiation prior to its being utilized in the curing process. Such debris also undesirably contaminates and degrades the performance of the optics which are utilized to collect and focus the extreme ultra-violet light. It also increases the vacuum pumping and filtering load on the system.

The generation of such debris is inherent to contemporary methodologies for producing extreme ultra-violet light and tends to increase as an attempt is made to increase the intensity of the extreme ultra-violet light.

According to one exemplary contemporary methodology for generating extreme ultra-violet light, a radiated energy beam such as the output of a high energy laser, electron beam, or arc discharge is directed onto a ceramic, thin-film, or solid target. Various different solid targets have been utilized. For example, it is known to form such targets of tungsten, tin, copper, and gold, as well as sold xenon and ice.

The low reflectivity of mirrors which are suitable for use at the desired extreme ultra-violet light wavelength inherently reduces the transmission of extreme ultra-violet light through the optical system and thus further necessitates the use of a high intensity extreme ultra-violet light source. Degradation of the mirrors and other optical components by contamination due to debris formed during the extreme ultra-violet light generation is thus highly undesirable. Of course, as the intensity of the extreme ultra-violet light generation process is increased (by increasing the intensity of the radiated energy beam directed onto the target), more debris are formed. Thus, when utilizing such solid target configurations, the goals of debris reduction and intensity enhancement tend to be mutually exclusive.

Consequently, the use of lasers and/or electron beams to ionize a gas flow so as to emit the desired intensity of extreme ultra-violet light while mitigating the production of undesirable debris is presently being investigated. Thus, it is known to utilize gas jets for the targets of lasers and electron beams in the production of extreme ultra-violet light. It is also known to cryogenically cool noble gases such as xenon and argon, so as to cause the gas to assume a super cooled state, wherein the individual atoms are drawn together into large clusters of several thousand atoms or more. While the use of such gas jets and/or cryogenic cooling methodologies have proven generally suitable for laboratory demonstrations, the vacuum pumping requirements necessary for such steady-state operation at high extreme ultra-violet light production rates is economically prohibitive.

As such, it is desirable to provide means for producing high intensity extreme ultra-violet light while minimizing the undesirable production of debris. It is further desirable to accomplish such extreme ultra-violet light production utilizing methodology which substantially reduces the vacuum pumping requirements, thereby correspondingly reducing the size, cost, and power requirements of the system.

SUMMARY OF THE INVENTION

The present invention specifically addresses and alleviates the above-mentioned deficiencies associated with the prior art. More particularly, the present invention comprises a method and apparatus for producing extreme ultra-violet light. The method comprises the steps of flowing a gas at a supersonic velocity, directing a radiated energy beam into the flowing gas to stimulate emission of extreme ultra-violet light therefrom, and capturing a substantial portion of the gas so as to mitigate contamination caused thereby. By capturing a substantial portion of the gas, the amount of debris available to contaminate the system's optical components is mitigated.

As used herein, the term debris is defined to include any atoms, molecules, electrons, ions, or other material which is a component of the flowing gas or which results from the interaction of the flowing gas in the radiated energy beam. As those skilled in the art will appreciate, a substantial portion of such debris is trapped within the gas flow jets, which itself is then captured so as to prevent contamination.

The step of flowing a gas at a supersonic velocity preferably comprises flowing a pressurized gas through a converging-diverging nozzle, so as to increase the velocity thereof. The converging-diverging nozzle preferably has a generally rectangular cross-section. The converging-diverging nozzle also preferably has a length substantially greater than the width thereof (a high aspect ratio).

According to the preferred embodiment of the present invention, both the nozzle from which the supersonic gas flows and the opening in the diffuser into which the supersonic gas is received are approximately 9 mm long and approximately 0.9 mm wide, thus giving both an aspect ratio of approximately 10. The diffuser preferably comprises a converging portion proximate the opening thereof having walls angled at approximately 6° to the gas flow axis thereof, so as to generate a stable system of shocks. The shocks decrease the velocity of the gas within the diffuser and increase the pressure thereof, as discussed in detail below.

Those skilled in the art will appreciate that the dimensions of the nozzle and the diffuser may be varied substantially, as desired. Moreover, the throat area, inlet to throat area ratio, throat length, and exit divergence angle of the diffuser are preferably optimized according to well known principles for a given jet in order to obtain desirable pressure recovery and minimize gas bypass (gas not received within the diffuser) of the diffuser.

The step of flowing a gas at a supersonic velocity preferably comprises expanding the gas so as to substantially decrease the temperature thereof. As those skilled in the art will appreciate, decreasing the temperature of the gas substantially increases a density thereof, by causing the atoms or molecules of the gas to tend to clump together, preferably in large clusters thereof. As those skilled in the art will further appreciate, the density increase due to such clumping substantially enhances the emission of extreme ultra-violet light therefrom.

According to the preferred embodiment of the present invention, the gas comprises a noble gas, preferably argon, helium, and/or xenon. The gas is preferably flowed at a velocity of at least Mach 2, preferably Mach 3.

The gas is preferably flowed at a supersonic velocity through a vacuum chamber, so as to facilitate photolithography, such as in the fabrication of integrated circuit components. The radiated energy beam preferably comprises either an electron beam, a laser beam, or a microwave beam. Those skilled in the art will appreciate that various other forms of radiated energy may likewise be suitable.

According to the preferred embodiment of the present invention, the radiated energy beam is directed proximate the converging-diverging nozzle from which the gas flows, such that the radiated energy beam passes through the flowing gas in a manner which mitigates absorption of the extreme ultra-violet light stimulated thereby back into the flowing gas. Thus, according to the preferred embodiment of the present invention, reabsorption of the stimulated extreme ultra-violet light, particularly by the flowing gas, is minimized. In order to accomplish this, the radiated energy beam is directed through the flowing gas proximate a surface thereof, so as to reduce the distance that the extreme ultra-violet light stimulated thereby must travel through the flowing gas. It will be appreciated that the amount of gas through which stimulated extreme ultra-violet light must travel is proportional to the distance between the point of emission, i.e., the point of interaction between the radiated energy beam and the flowing gas, and the outer edge or surface of the flowing gas, beyond which the extreme ultra-violet light passes substantially only through vacuum.

Thus, by positioning the radiated energy beam such that it passes through the flowing gas proximate a surface thereof, extreme ultra-violet light stimulated by the radiated energy beam within the flowing gas travels through less of the flowing gas than would be the case if the radiated energy beam were positioned deeper inside the flowing gas.

According to the present invention, a substantial portion of the gas is received within a diffuser which is configured to reduce the velocity of the gas and also to increase the pressure thereof. Thus, the diffuser mitigates the contamination of system optical component by reducing the amount of gas flowing within the vacuum chamber. The use of the diffuser also reduces the load upon the vacuum pump by reducing the pumping requirements thereof.

Further, according to the methodology of the present invention, the gas captured by the diffuser is recycled such that it repeatedly flows from the nozzle and is repeatedly stimulated to provide extreme ultraviolet light. Further, according to the preferred embodiment of the present invention, that gas removed from the vacuum chamber by the vacuum pump is also recycled.

The aspect ratio of the cross-section of the diffuser, a the opening thereof, is preferably similar to and approximate that of the aspect ratio of the cross-section of the converging-diverging nozzle, at the exit thereof from which the gas flows. Alternatively, the aspect ratio of the cross-section of the diffuser, at the opening thereof, may be different from that of the aspect ratio of the cross-section of the converging-diverging nozzle at the exit thereof. For example, the opening of the diffuser may optionally be substantially larger in cross-sectional area than the exit of the converging-diverging nozzle, so as to enhance the capture of the flowing gas. As those skilled in the art will appreciate, when the cross-sectional area of the opening of the diffuser is substantially larger than the cross-sectional area of the exit of the converging-diverging nozzle, then the aspect ratio of the opening of the diffuser becomes less critical.

Thus, according to the methodology of the present invention, a substantial portion of the kinetic energy of the gas is converted into pressure, so as to facilitate more efficient recycling thereof. As those skilled in the art will appreciate, the gas must be provided to the nozzle at a substantial pressure, so as to effect supersonic flow thereof. By converting a substantial portion of the kinetic energy of the gas into pressure, the pumping requirements of the system are substantially reduced, thereby reducing the costs of constructive and operating the system. The pumping requirements are substantially reduced since the difference between the input and output pressure of the pump is reduced when the input pressure is increased, as by converting a substantial portion of the kinetic energy of the gas flow into pressure.

The gas captured by the diffuser, and optionally the gas removed by the vacuum pump as well, is compressed, so as to increase the pressure thereof to that pressure required for achieving the desired gas flow speed from the nozzle. Heat is removed from the gas prior to its being provided to the nozzle, so as to facilitate the desired cooling thereof upon expansion as the gas exits the nozzle.

According to the preferred embodiment of the present invention, the diffuser comprises at least one knife edge which is configured so as to reduce the velocity of the gas captured thereby. As those skilled in the art will appreciate, various different configurations of such knife edges are suitable for reducing the velocity of the gas captured by the diffuser. For example, the knife edges may comprise concentric, generally parallel sets thereof, having generally rectangular, round, or oval shapes, for example. Alternatively, the knife edges may comprise a plurality of generally horizontal or vertical members. It is also contemplated that one or more point-type knife edges, configured generally as pointed needles may alternatively be utilized to generate shock waves.

Thus, according to the present invention, the nozzle and diffuser inlet are configured to utilize gas dynamics properties of a supersonic jet of gas to direct debris formed during interaction of the radiated energy beam and the gas jet into the diffuser, and thus mitigate contamination of the system's optical components thereby. In this manner the collecting and focusing optics, for example, are maintained in a substantially contamination free manner, so as to enhance the integrated circuit fabrication process performed therewith. As those skilled in the art will appreciate, by reducing the contamination of such optical components, maintenance, i.e., cleaning, of the system's optical components, is substantially reduced and the production rate is increased, thereby providing a substantial economic advantage.

Collecting and focusing optics collect the extreme ultra-violet light and focus the extreme ultra-violet light upon the desired target, e.g., a mask being cured upon the integrated circuit component(s) being fabricated.

Thus, the methodology and apparatus of the present invention provides means for producing extreme ultra-violet light in an photolithography system for facilitating the production of semi-conductor components having geometries of 10 nm (nanometers) and smaller. According to the present invention, means for producing high-intensity extreme ultra-violet light while minimizing the undesirable production of debris are provided. Such extreme ultra-violet light production is further accomplished utilizing methodology which substantially reduces the vacuum pumping requirements, thereby correspondingly reducing the size, cost, and power requirements for the system.

These, as well as other advantages of the present invention will be more apparent from the following description and drawings. It is understood that changes in the specific structure shown and described may be made within the scope of the claims without departing from the spirit of the invention.

BRIEF DESCRIPTION OF THE DRAWINGS

FIG. 11 shows the calculated density field of an extreme ultra-violet light source jet and diffuser using xenon gas and showing the shock resulting from the supersonic gas flow impinging upon the inner walls of the diffuser.

DETAILED DESCRIPTION OF THE PREFERRED EMBODIMENT

The detailed description set forth below in connection with the appended drawings is intended as description of the presently preferred embodiment of the invention and is not intended to represent the only form in which the present invention may be constructed or utilized. The description sets forth the functions and the sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 1:
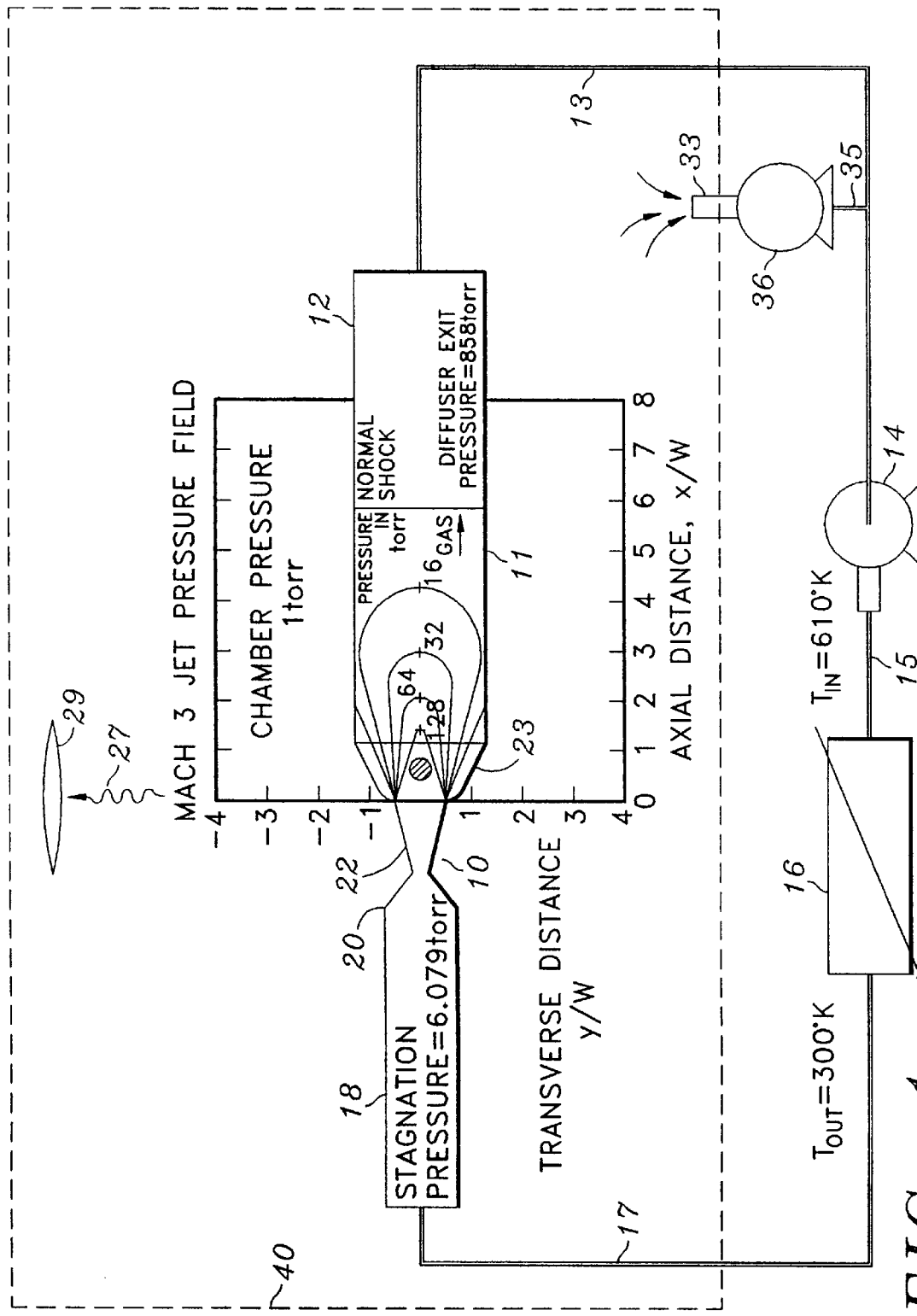
FIG. 1 is a schematic representation of the extreme ultra-violet photolithography system for facilitating the prodtion of semi-conductor components having geometries of 10 nm and smaller, and showing a pressure profile for the flowing gas exiting the converging-diverging nozzle thereof.

The extreme ultra-violet photolithography system for facilitating production of semi-conductor components having geometries of 10 nm and smaller of the present invention is illustrated in FIGS. 1–11, which depict a presently preferred embodiment thereof. Referring now to FIG. 1, the extreme ultra-violet photolithography system generally comprises a converging-diverging nozzle 10 from which gas 11 flows, at a supersonic velocity, toward diffuser 12 which captures a substantial portion of the flowing gas 11. The converging-diverging nozzle 10 and the diffuser 12, as well as the collecting and focusing optics 29 and the work piece, i.e., integrated circuit chip(s) being fabricated, are all preferably disposed within a common vacuum chamber 40, so as to facilitate integrated circuit fabrication utilizing photolithography.

As described in detail below, the diffuser 12 reduces the velocity of the flowing gas 11, while simultaneously increasing the pressure thereof. Gas flows from the diffuser 12 via conduit 13 to compressor 14, which preferably comprises a 0.71 hp compressor. The compressor 14 compresses, i.e., increases the pressure of, the gas 11 such that it may be recycled to the converging-diverging nozzle 10 and thus used repeatedly to produce extreme ultra-violet light. Gas flows from the compressor 14 to heat exchanger 16, preferably a 64.1 btu/min heat exchanger for removing heat from the compressed gas.

According to the preferred embodiment of the present invention, the temperature of the gas entering the heat exchanger 16 is approximately 610° K and the temperature of the gas exiting the heat exchanger 16 is approximately 300° K. The gas exiting the heat exchanger 16 is communicated via conduit 17 to the converging-diverging nozzle 10 where a stagnation pressure of 6,079 torr is developed. Stagnation pressure is defined herein as that gas pressure when no flow occurs.

Figure 2:
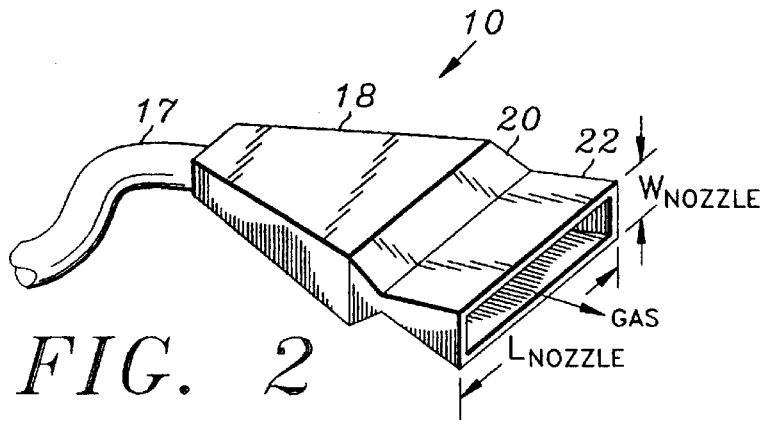
FIG. 2 is a perspective view of the converging-diverging nozzle of the present invention.

Referring now to FIG. 2 also, the converging-diverging nozzle 10 more particularly comprises a pressure plenum 18 into which the compressed gas from the heat exchanger 16 flows. The converging-diverging nozzle 10 further comprises a converging portion 20 and a diverging portion 22. The converging-diverging nozzle 10 is configured so as to accelerate the gas flowing therethrough to a supersonic velocity, preferably above Mach 2, preferably approximately Mach 3.

The diverging portion 22 preferably has a generally rectangular cross-section and is preferably configured such that the length, Dimension L, is substantially greater than the width, Dimension W, thereof. This configuration provides a high aspect ratio which facilitates the exposure of a substantial portion of the flowing gas to the radiated energy beam and which provides a short path for extreme ultra-violet light stimulated thereby through the flowing gas.

Figure 3:
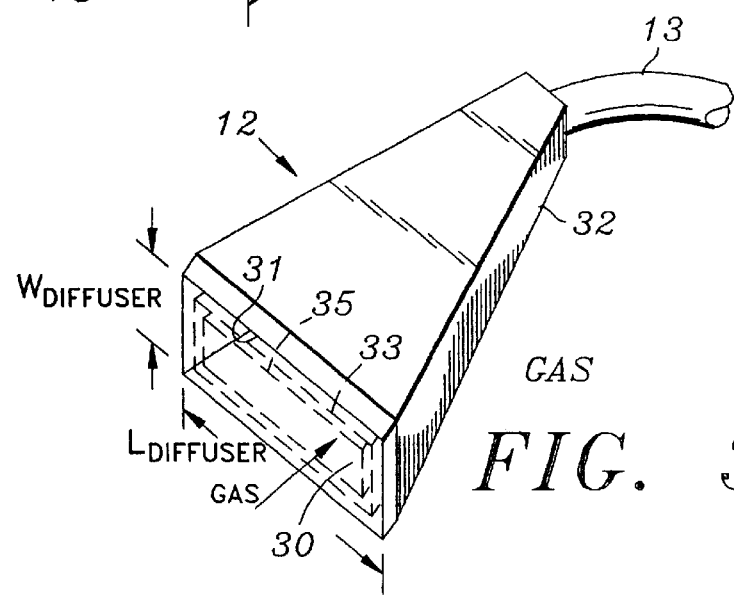
FIG. 3 is a perspective view of the diffuser of the present invention.

Referring now to FIGS. 1 and 3, the diffuser 12 generally comprises an opening which corresponds generally in size and configuration to that of the widest portion of the diverging portion of the converging-diverging nozzle 10. Thus the opening of the diffuser has a length which is preferably slightly longer than the length of the converging-diverging nozzle 10 and has a width which is preferably slightly longer than the width of the converging-diverging nozzle, so as to capture a substantial portion of the gas flowing from the converging-diverging nozzle 10. Those skilled in the art will appreciate that various different configurations of the diffuser 12 are suitable.

The diffuser decreases in cross-sectional area from the opening 30 thereof to the coupling end 32 thereof, at which the fluid conduit 13 attaches. As discussed in detail below, the cross-sectional area of the diffuser 12 optionally increases again, from the narrowest portion thereof, so as to define a throat. Such tapering or narrowing of the cross-sectional area of the diffuser 12 provides a gradual slowing of the gasses captured thereby, while minimizing the occurrence of undesirable regurgitation which might otherwise occur.

Optionally, one or more knife edges are formed in or proximate the diffuser 12, so as to aid in the deceleration of the gasses entering the opening 30. According to the preferred embodiment of the present invention, the periphery of the opening 30 of the diffuser 12 is formed as a first knife edge 31. Additional concentric generally rectangular knife edges 33 and 35 are disposed within the opening 30 of the diffuser 12 and mounted thereto via any suitable means. Knife edge struts may optionally be utilized to mount the second 33 and third 35 concentric rectangular knife edges in place within the opening 30 of the diffuser 12. Those skilled in the art will appreciate that various different numbers and configurations of such knife edges may be utilized to effect generation of shocks which tend to decrease the velocity of the supersonic gas while simultaneously increasing the pressure thereof within the diffuser 12.

Isobaric pressure profiles of the gas flowing from the converging-diverging nozzle 10 are provided in FIG. 1. As shown, the radiated energy beam, an electron beam according to the preferred embodiment of the present invention, is directed into that portion of the flowing gas 11 proximate the converging-diverging nozzle 10, so as to enhance the efficiency of the present invention. This is better shown in FIG. 4 which illustrates the relative positions of the electron beam 23 and the flowing gas 11 in perspective.

A portion of the extreme ultra-violet light 27 whose emission is stimulated from the flowing gas 11 by the radiated energy beam 23 is collected and focused by collecting and focusing optics 29, which direct the extreme ultra-violet light onto a work piece, i.e., an integrated circuit component being fabricated, as desired.

According to the preferred embodiment of the present invention, a vacuum pump, preferably that vacuum pump 36 utilized to evacuate the vacuum chamber 40 within which the gas 11 flows and within which the photolithographic process is performed, evacuates a substantial portion of the gas 11 which is not captured by the diffuser 12 and provides that gas 11 back to the converging-diverging nozzle 10, preferably via the compressor 14 and heat exchanger 16, so as to facilitate recycling thereof.

Figure 4:
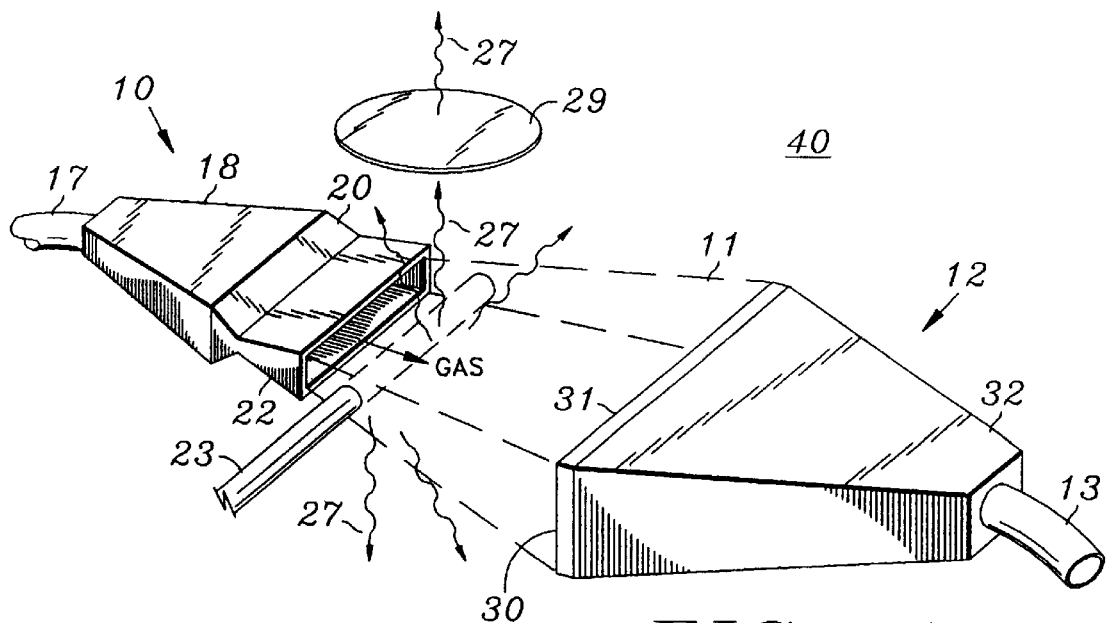
FIG. 4 is a perspective view showing gas flowing from the converging-diverging nozzle into the diffuser and also showing a radiated energy beam stimulating the emission of extreme ultra-violet light from the flowing gas, a portion of the extreme ultra-violet light being collected and focused by system optics.

Referring now to FIG. 4, in operation a gas, preferably a noble gas such as argon, helium, or xenon, or a combination thereof, flows at a supersonic velocity from the converging-diverging nozzle 18 when a pressurized supply thereof is provided to the converging-diverging nozzle 18 via gas conduit 17. Sufficient pressure is provided by compressor 14 to achieve the desired gas flow speed.

A radiated energy beam, preferably an electron beam, is directed through the supersonic gas flow 11 at a position which minimizes the transmission of the resulting extreme ultra-violet light through the gas 11, thereby mitigating undesirable absorption thereof.

A substantial portion of the flowing gas 11 is captured by the diffuser 12 and recycled. A substantial portion of the gas not captured by the diffuser 12 is evacuated from the vacuum chamber 40 via vacuum pump 36 and recycled.

At least a portion of the extreme ultra-violet light 27 emitted due to the interaction of the radiated energy beam 23 with the supersonic gas 11 is collected and focused by collecting and focusing optics 29 so as to facilitate photolithography therewith.

Thus, according to the present invention, contamination of the collecting and focusing optics 29, as well as any other sensitive surfaces within the vacuum chamber 40, is mitigated. Such contamination is mitigated since supersonic flow of the gas 11 tends to force all of the gas particles, i.e., molecules, atoms, ions, electrons, etc., into the diffuser 12, thereby substantially mitigating the amount of such particles floating freely within the vacuum chamber 40 and capable of coming into contact with such sensitive items.

The present invention takes advantage of the gas dynamic properties of the supersonic jet to direct any debris generated during the plasma formation into the diffuser, and thus away from the collection and focusing optics 29, as well as the rest of the photolithography system.

The efficiency of the present invention is enhanced by minimizing the amount of gas 11 through which the generated extreme ultra-violet light 27 must pass. As those skilled in the art will appreciate, extreme ultra-violet light is readily absorbed (and thus attenuated) by the noble gasses from which its emission is stimulated. Thus, it is very desirable to minimize the distance through which the extreme ultra-violet light 27 must travel through such gas. This is accomplished by positioning the radiated energy beam 23 close to the surface of the flowing gas 11, preferably by positioning the radiated energy beam 23 proximate the converging-diverging nozzle 10 where the gas flow has a comparatively narrow cross-sectional area and comparatively high density.

Thus, according to the present invention, the high density gas region is confined to nearly the same volume as that occupied by the radiated energy beam. Thus, extreme ultra-violet light generated thereby is not required to travel through a substantial portion of the high density gas after leaving the area where stimulated emission occurs.

The high aspect ratio configuration of the converging-diverging nozzle tends to maximize the volume of flowing gas available for interaction with the radiated energy beam, while simultaneously minimizing the volume of flowing gas which attenuates the stimulated extreme ultra-violet light.

As those skilled in the art will appreciate, the higher the velocity of the flowing gas 11, the smaller the mass flow thereof which will diverge or turn away from the gas flow, i.e., jet, when surrounded by the very low pressure of the vacuum chamber. Any such flow which diverges from the gas jet into the high vacuum surrounding the gas jet must ultimately be pumped out against a very high adverse pressure ratio, which adds substantially to the cost of manufacturing and maintaining the system. Even more important, the gas that diverges from the gas jet becomes a potential contaminant for the collecting and focusing optics and also becomes an undesirable attenuating mass for the extreme ultra-violet light which is produced by the interaction of the radiated energy beam and the gas flow.

Further, by converting a significant portion of the kinetic energy of the flowing gas 11 into pressure, the need to increase the pressure of the gas via the compressor 14 is reduced, thereby facilitating operation with a smaller capacity and less expensive compressor 14.

Figure 5:
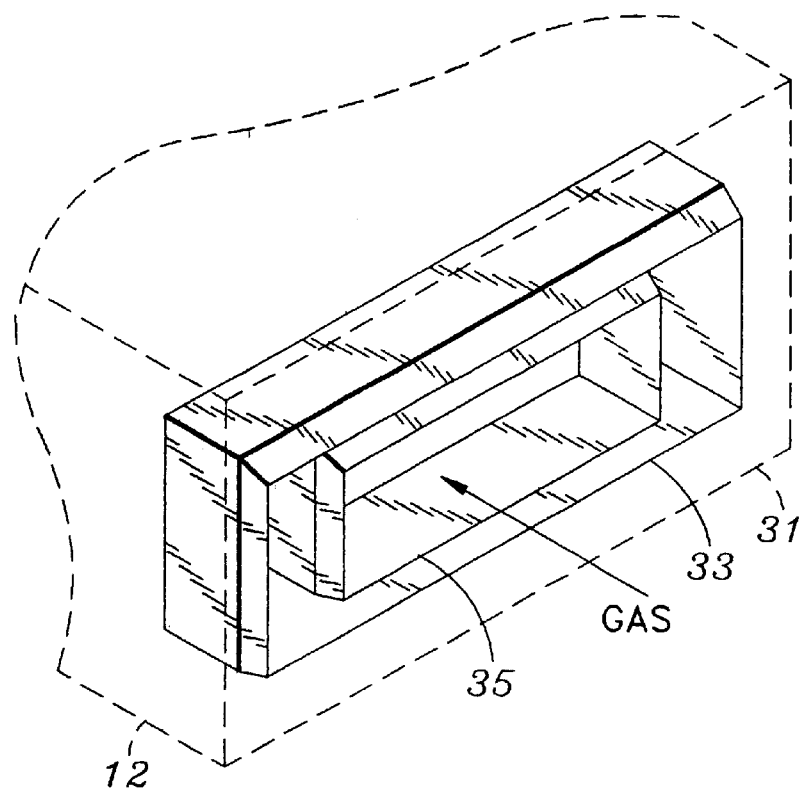
FIG. 5 is an enlarged view of a set of knife edges configured as concentric rectangular members for reducing the speed of the incoming gas while simultaneously increasing the pressure thereof.
Figure 6:
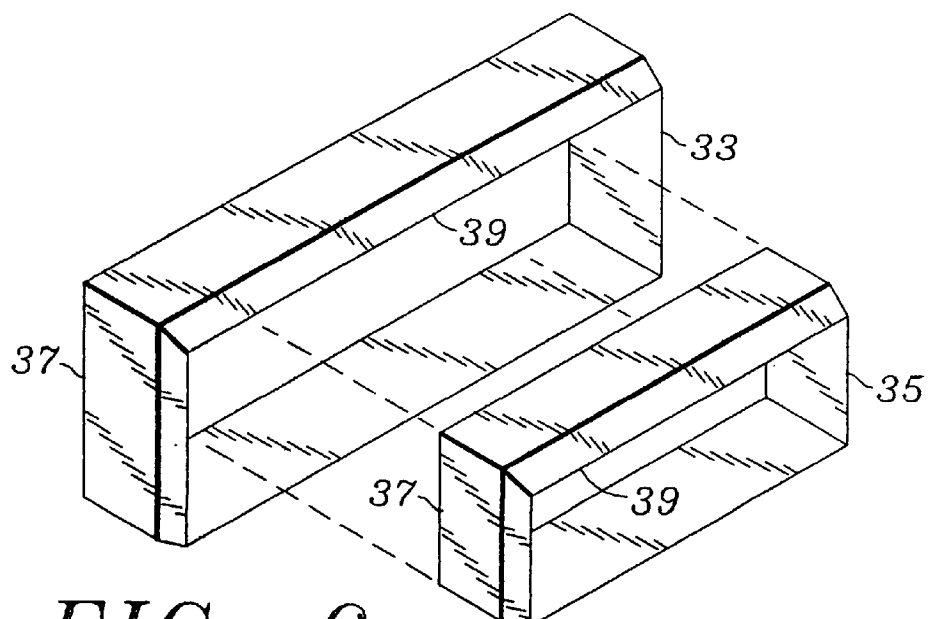
FIG. 6 is an exploded perspective view of the rectangular knife edges of FIG. 5.
Figure 7:
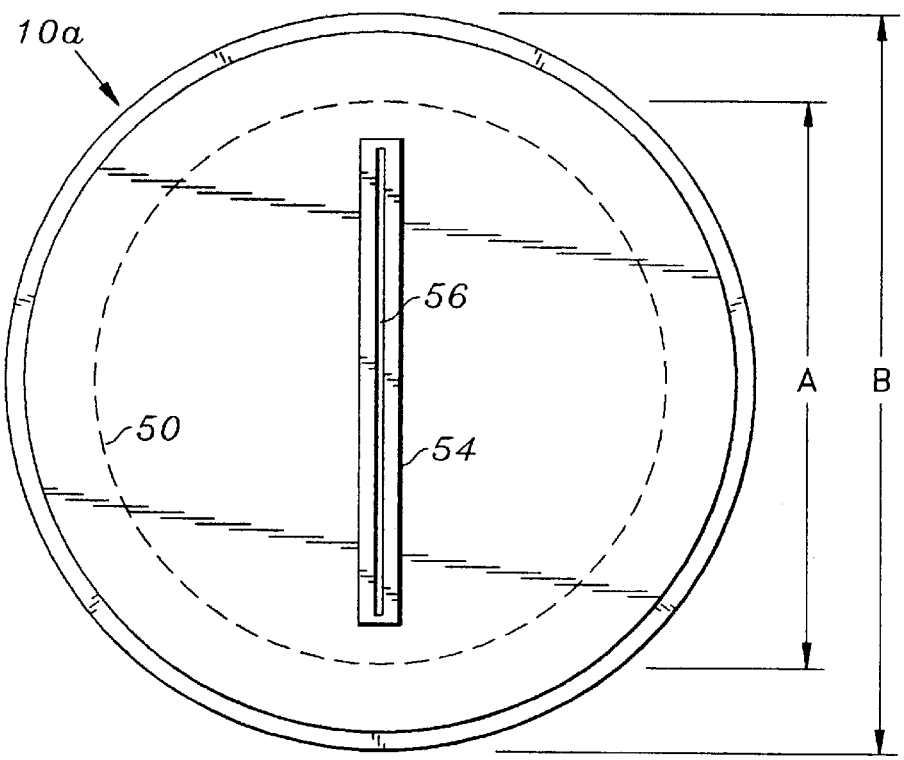
FIG. 7 is an end view of the converging-diverging nozzle which is configured as a flange or cap so as to easily attach to a pulse generator.

Referring now to FIGS. 5 and 6, the generally rectangular concentric knife edges 33, 35 of FIG. 3 are shown in further detail. Each generally concentric knife edge 33, 35 preferably comprises a body 37 and a bevel 39. As those skilled in the art will appreciate, it is the purpose of each knife edge 31, 33, and 35 to produce a shock wave, similar in nature to the sonic boom shock wave associated with supersonic aircraft, which defines a region of increased pressure within the diffuser 12, and thus facilitates reduction of the speed of the flowing gas 11 and simultaneously facilitates an increase in the pressure thereof.

Figure 8:
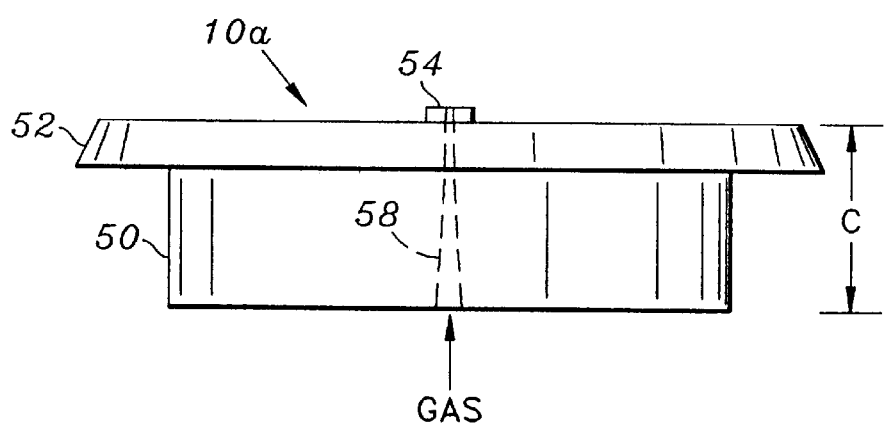
FIG. 8 is a side view of the converging-diverging nozzle of FIG. 7.

Referring now to FIG. 8, the converging-diverging nozzle is optionally configured as a cap 10a which is specifically sized and shaped to fit a standard pulse generator. Thus, the cap 10a comprises a body 50 which is sized to be received within the exit orifice of a pulse generator and a flange 52 which functions as a stop to limit insertion of the body 50 into the exit orifice. A rectangular boss 54 has a rectangular opening 56 formed therein. The converging-diverging bore 58 of the nozzle is formed in a continuous or co-extensive manner in the body 50, flange 52, and boss 54. Such construction facilitates easy removal and replacement of the converging-diverging nozzle 10a, particularly when a standard pulse generator is utilized.

Figure 9:
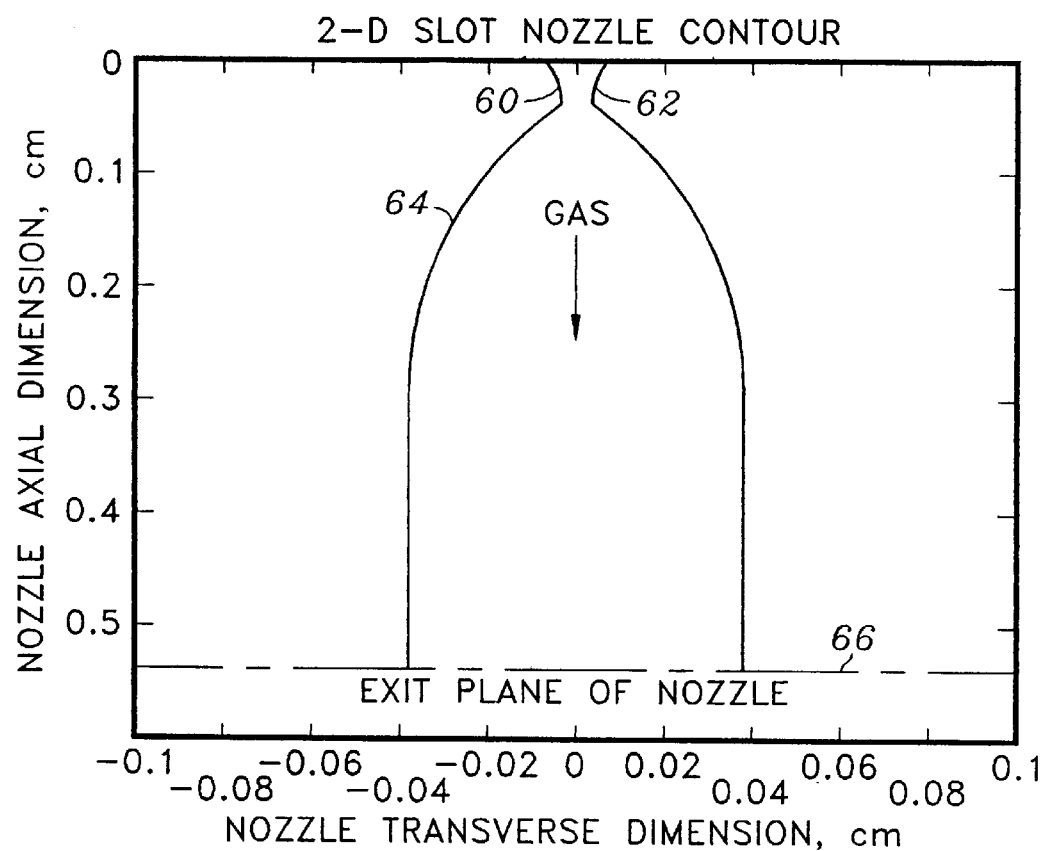
FIG. 9 is a detailed cross-sectional profile of the diverging portion of the converging-diverging nozzle.

Referring now to FIG. 9, a preferred cross-sectional profile of a nozzle orifice is shown. The nozzle comprises a converging region 60 which decreases to form a neck 62 and then increases in cross-sectional area to form the diverging region 64 thereof. The exit plane 66 is that plane of the nozzle flush with the end thereof, i.e., the outer opening thereof.

Figure 10:
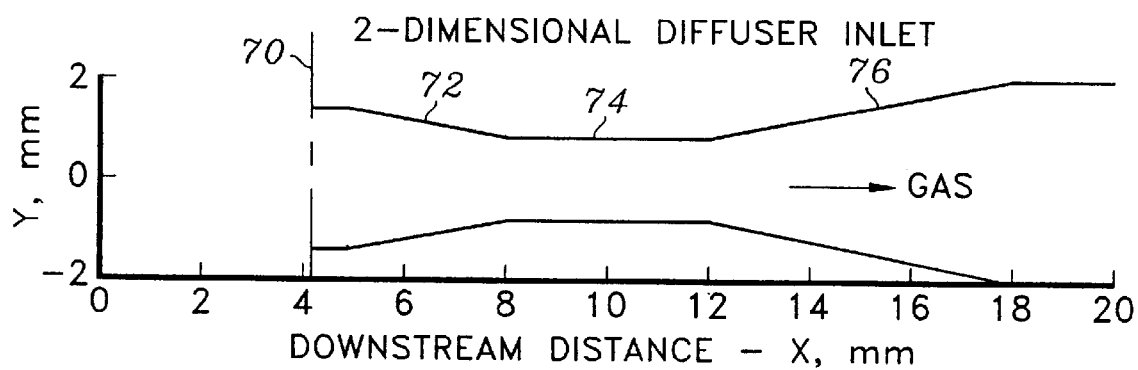
FIG. 10 is a detailed cross-sectional profile of the diffuser.

Referring now to FIG. 10, the cross-sectional profile of the diffuser is shown. According to the present invention, the diffuser tapers or converges from the entry plane 70 to define a converging portion 72 thereof. At the end of the converging portion 72 a neck 74 is formed and the diffuser may then optionally diverge or increase in cross-sectional area so as to form a diverging portion 76. As those skilled in the art will appreciate, the velocity of the flowing gas 11 decreases within the converging portion 72, while the pressure thereof simultaneously increases.

Referring now to FIG. 11, the calculated density field for a xenon extreme ultra-violet light source jet and diffuser is shown. Gas 11a from within the converging-diverging nozzle exits therefrom at the exit plane 66 to form gas jet 11b. The gas jet 11b enters the diffuser at the entry plane 70 thereof. Within the diffuser 12 first oblique shocks 80 are formed due to the knife edge(s) 31 defined by the opening 30 of the diffuser 12. The oblique shocks 80 interact to form perpendicular shock 82 downstream therefrom. Second oblique shocks 84 are formed as the flowing gas interacts with the internal walls of the diffuser. The second oblique shocks 84 interact with one another so as to form perpendicular shock 86. Third oblique shocks 88 are formed in a similar manner downstream from the second oblique shocks 84. As those skilled in the art will appreciate, each shock defines a high pressure region within which the flowing gas slows. In this manner a plurality of knife edges may be utilized to form shocks so as to effect slowing of the gas flow and increasing the pressure thereof.

It is understood that the exemplary method and apparatus for producing extreme ultra-violet light described herein and shown in the drawings represents only a presently preferred embodiment of the invention. Indeed, various modifications and additions may be made to such embodiment without departing from the spirit and scope of the invention. For example, various sizes, shapes, crosssectional configurations, etc. of the nozzle and diffuser are contemplated. It must further be appreciated that various different configurations of the radiated energy beam, other than circular as shown, may be utilized. For example, the radiated energy beam 23 may alternatively be elliptical, square, rectangular, triangular, etc. It is generally desirable that the radiated energy beam 23 be comparable in cross-sectional area to that portion of the flowing gas 11 proximate the converging-diverging nozzle 10, so as to minimize the amount of gas 11 through which stimulated extreme ultra-violet light 27 must flow. Further, it must be appreciated that the method and apparatus for producing extreme ultra-violet light according to the present invention may be utilized in a variety of different applications, and is not limited to use in photolithographic applications. Further, it must also be appreciated that the general method and apparatus of the present invention may alternatively be utilized to produce wavelengths of electromagnetic radiation other than extreme ultra-violet, and thus is not limited to the production of extreme ultra-violet light.

Thus, these and other modifications and additions may be obvious to those skilled in the art and may be implemented to adapt the present invention for use in a variety of different applications.

What is claimed is:

1. A method for producing extreme ultra-violet light, the method comprising:

flowing a gas at a supersonic velocity by flowing the gas through a converging-diverging nozzle;

directing a radiated energy beam into the flowing gas to stimulate emission of extreme ultra violet light from the gas; and capturing a substantial portion of the gas so as to mitigate contamination caused by the gas.

2. The method as recited in claim 1 wherein the step of flowing a gas at a supersonic velocity comprises flowing a gas at a supersonic velocity through a converging-diverging nozzle having a generally rectangular cross-section.

3. The method as recited in claim 1 wherein the step of flowing a gas at a supersonic velocity comprises flowing a gas at a supersonic velocity through a converging-diverging nozzle having a generally rectangular cross-section and also having a length substantially greater than a width of the cross-section.

4. The method as recited in claim 1 wherein the step of flowing a gas at a supersonic velocity comprises flowing a gas at a supersonic velocity through a converging-diverging nozzle having an aspect ratio of approximately 10 to 1.

5. The method as recited in claim 1 wherein the step of flowing a gas at a supersonic velocity comprises expanding the gas so as to substantially decrease a temperature of the gas, and thus substantially increase a density of the gas, so as to enhance the emission of extreme ultra-violet light from the gas.

6. The method as recited in claim 1 wherein the step of flowing a gas at a supersonic velocity comprises flowing a noble gas at a supersonic velocity.

7. The method as recited in claim 1 wherein the step of flowing a gas at a supersonic velocity comprises flowing, in part, at least an argon gas, helium gas, or xenon gas at a supersonic velocity.

8. The method as recited in claim 1 wherein the step of flowing a gas at a supersonic velocity comprises flowing the gas at a velocity of approximately Mach 3.

9. The method as recited in claim 1 wherein the step of flowing a gas at a supersonic velocity comprises flowing the gas through a vacuum.

10. The method as recited in claim 1 wherein the steps of flowing a gas at a supersonic velocity, directing a radiated energy beam into the flowing gas, and capturing a substantial portion of the gas are performed substanially within a vacuum.

11. The method as recited in claim 1 wherein the step of directing a radiated energy beam into the flowing gas comprises directing an electron beam into the flowing gas.

12. The method as recited in claim 1 wherein the step of directing a radiated energy beam into the flowing gas comprises directing a laser beam into the flowing gas.

13. The method as recited in claim 1 wherein the step of directing a radiated energy beam into the flowing gas comprises directing a microwave beam into the flowing gas.

14. The method as recited in claim 1 wherein the step of directing a radiated energy beam into the flowing gas comprises directing the radiated energy beam proximate the converging-diverging nozzle.

15. The method as recited in claim 1 wherein the step of directing a radiated energy beam into the flowing gas comprises directing the radiated energy beam through the flowing gas in a manner which mitigates absorption of the extreme ultra-violet light back into the flowing gas.

16. The method as recited in claim 1 wherein the step of directing a radiated energy beam into the flowing gas comprises directing the radiated energy beam through the flowing gas proximate a surface of the flowing gas so as to reduce a distance that the extreme ultra-violet light must travel through the flowing gas, thus mitigating absorption of the extreme ultra-violet light.

17. The method as recited in claim 1 wherein the step of capturing a substantial portion of the gas comprises receiving the substantial portion of the gas within a diffuser, the diffuser being configured to reduce the velocity of the gas and to increase the pressure of the gas.

18. The method as recited in claim 1 wherein the step of capturing a substantial portion of the gas comprises receiving the substantial portion of the gas within a diffuser having a cross-section approximate to the cross-section of the converging-diverging nozzle.

19. The method as recited in claim 1 wherein the step of capturing a substantial portion of the gas comprises receiving the substantial portion of the gas within a diffuser, and pumping a substantial portion of the gas, which is not received within the diffuser, via a vacuum pump, so as to facilitate recycling of the gas.

20. The method as recited in claim 1 further comprising the step of recycling the gas, such that captured gas is repeatedly flowed at a supersonic velocity and stimulated into emitting extreme ultra-violet light.

21. The method as recited in claim 1 wherein the step of capturing a substantial portion of the gas comprises converting a substantial portion of a kinetic energy of the gas into pressure, so as to facilitate recycling of the gas.

22. The method as recited in claim 1 further comprising the steps of compressing the portion of gas captured and removing heat from the gas catured, so as to facilitate recycling of the gas.

23. The method as recited in claim 1 wherein the step of capturing a substantial portion of the gas comprises flowing the gas over at least one knife edge to reduce the velocity of the gas.

24. The method as recited in claim 1 wherein the step of capturing a substantial portion of the gas comprises flowing the gas over a plurality of concentric, generally rectangular knife edges.

25. The method as recited in claim 1 wherein the method for producing extreme ultra-violet light is used in the production of a semiconductor component.

26. A method for producing extreme ultra-violet light in a photolithography system for production of semiconductor components, the method comprising:
   providing a vacuum chamber;
   flowing a gas through a converging-diverging nozzle at a supersonic velocity into the vacuum chamber;
   directing a radiated energy beam into the flowing gas to stimulate emission of extreme ultra violet light from the gas;
   collecting the extreme ultra-violet light and focusing the extreme ultra-violet light so as to facilitate photolithography with the extreme ultra-violet light;
   capturing a substantial portion of the gas so as to mitigate contamination of the collecting and focusing optics thereby, the gas being captured by a diffuser which reduces a velocity of the gas and increases a pressure thereof; and
   recycling the gas captured by the diffuser to the nozzle such that the captured gas is repeatedly flowed at supersonic velocity and stimulated into emitting extreme ultra-violet light.

27. The method as recited in claim 26, wherein the semiconductor component comprises a transistor.

28. A recycling gas target jet for producing extreme ultra-violet light comprising:
   a converging-diverging nozzle for accelerating a gas to form a supersonic jet of gas; and
   a radiated energy source for providing a radiated energy beam, the radiated energy beam being incident upon the supersoric jet of gas and stimulating extreme ultra-violet light emission from the jet of gas; and
   a diffuser into which the supersonic jet of gas is directed, the diffuser inlet comprising a diffuser configured to reduce the velocity of the gas and to increase the pressure thereof;
   wherein the nozzle and the diffuser inlet are configured to utilize gas dynamics properties of the supersonic jet of gas to direct debris formed during interaction of the electron beam and the gas jet into the inlet and thus mitigate contamination of system optical components thereby.

29. The recycling gas target jet as recited in claim 28 wherein the converging-diverging nozzle has a generally rectangular cross-section and an aspect ratio of approximately 10 to 1.

30. The recycling gas target jet as recited in claim 28 wherein the converging-diverging nozzle is configured so as to expand the gas so as to substantially decrease a temperature of the gas, and thus substantially increase a density of the gas, so as to enhance the emission of extreme ultra-violet light from the gas.

31. The recycling gas target jet as recited in claim 28 wherein the gas comprises a noble gas.

32. The recycling gas target jet as recited in claim 28, wherein the gas comprises at least an argon gas, helium gas, or xenon gas.

33. The recycling gas target jet as recited in claim 28 wherein the converging-diverging nozzle comprises a converging-diverging nozzle configured to flow the gas at a velocity at approximately Mach 3.

34. The recycling gas target jet as recited in claim 28 further comprising a vacuum chamber within which the gas flows.

35. The recycling gas target jet as recited in claim 28 wherein the radiated energy source comprises an electron beam source.

36. The recycling gas target jet as recited in claim 28 wherein the radiated energy source comprises a laser.

37. The recycling gas target jet as recited in claim 28 wherein the radiated energy source comprises a microwave source.

38. The recycling gas target jet as recited in claim 28 wherein the radiated energy source is configured to direct the radiated energy beam proximate the converging-diverging nozzle.

39. The recycling gas target jet as recited in claim 28 wherein the radiated energy source is configured to direct the radiated energy beam through the gas in a manner which mitigates absorption of the extreme ultra-violet light back into the flowing gas.

40. The recycling gas target jet as recited in claim 28 wherein the radiated energy source is configured to direct the radiated energy beam through the flowing gas proximate a surface of the flowing gas so as to reduce a distance that extreme ultra-violet light must travel through the gas, thus mitigating absorption of the extreme ultra-violet light.

41. The recycling gas target jet as recited in claim 28 further comprising a diffuser for substantially capturing the gas.

42. The recycling gas target jet as recited in claim 28 further comprising a vacuum pump for pumping a substantial portion of the gas not received within the diffuser back to the nozzle, so as to facilitate recycling of the gas.

43. The recycling gas target jet as recited in claim 28 further comprising:

a compressor for compressing gas captured by the diffuser;

a heat exchanger for cooling the gas captured by the diffuser; and wherein compressing and cooling the gas captured by the diffuser facilitates recycling of the gas.

44. The recycling gas target jet as recited in claim 28 further comprising a plurality of knife edges formed proximate a diffuser to reduce the velocity of the gas and increase the pressure of the gas.

45. An extreme ultra-violet system comprising:

a vacuum chamber;

a nozzle for flowing a gas at a supersonic velocity into the vacuum chamber;

a source of radiated energy for directing a radiated energy beam into the flowing gas to stimulate emission of extreme ultra-violet light from the gas;

collecting and focusing optics for collecting the extreme ultra-violet light and for focusing the extreme ultra-violet light;

a diffuser for capturing a substantial portion of the gas so as to mitigate contamination of the collecting and focusing optics; and a recycling system for providing gas captured by the diffuser to the nozzle, such that the gas is repeatedly used to generate extreme ultra-violet light.

* * * * *